(12) United States Patent
Lee et al.

(10) Patent No.: US 8,592,833 B2
(45) Date of Patent: Nov. 26, 2013

(54) ORGANIC LIGHT EMITTING DIODE DISPLAY INCLUDING A MICROLENS ARRAY

(75) Inventors: So-Young Lee, Yongin (KR); Sun-Young Lee, Yongin (KR); Yoon-Hyeung Cho, Yongin (KR); Min-Ho Oh, Yongin (KR); Byoung-Duk Lee, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 13/042,314

(22) Filed: Mar. 7, 2011

(65) Prior Publication Data

US 2011/0233570 A1    Sep. 29, 2011

(30) Foreign Application Priority Data

Mar. 23, 2010  (KR) .................. 10-2010-0025946

(51) Int. Cl.
*H01L 29/18*    (2006.01)

(52) U.S. Cl.
USPC .................. 257/88; 257/E51.018

(58) Field of Classification Search
USPC ......... 257/88, E51.018, 59, 72, 102, E33.001
See application file for complete search history.

(56) References Cited

U.S. PATENT DOCUMENTS

| | | | |
|---|---|---|---|
| 2005/0231085 A1* | 10/2005 | Song et al. | 313/110 |
| 2007/0058260 A1* | 3/2007 | Steenblik et al. | 359/626 |
| 2007/0285410 A1* | 12/2007 | Shibasaki et al. | 345/204 |

FOREIGN PATENT DOCUMENTS

| | | |
|---|---|---|
| JP | 2004-342448 A | 12/2004 |
| KR | 10-2005-0101425 (A) | 10/2005 |
| KR | 10-0660591 B1 | 12/2006 |
| KR | 10-2008-0090945 A | 10/2008 |
| KR | 10-2009-0126597 (A) | 12/2009 |

* cited by examiner

*Primary Examiner* — Vongsavanh Sengdara
(74) *Attorney, Agent, or Firm* — Knobbe Martens Olson & Bear LLP

(57) ABSTRACT

An organic light emitting diode (OLED) display including a microlens array is disclosed. In one embodiment, the OLED includes a substrate and an organic light emitting diode including a first electrode formed on the substrate, an organic emission layer formed on the first electrode, and a second electrode formed on the organic emission layer. The OLED also includes an encapsulation layer covering the organic light emitting diode, wherein part of the encapsulation layer contacts the substrate, and a microlens array neighboring the encapsulation layer. In one embodiment, the distance between the organic emission layer and the microlens array is about 0.5 μm to about 300 μm.

6 Claims, 6 Drawing Sheets

ORGANIC LIGHT EMITTING DIODE DISPLAY INCLUDING A MICROLENS ARRAY

RELATED APPLICATIONS

This application claims priority to and the benefit of Korean Patent Application No. 10-2010-0025946 filed in the Korean Intellectual Property Office on Mar. 23, 2010, the entire contents of which are incorporated herein by reference.

BACKGROUND

1. Field

The described technology generally relates to an organic light emitting diode display, and more particularly, to an organic light emitting diode display including a microlens array.

2. Description of the Related Technology

Recently, an organic light emitting diode (OLED) display has been drawing attention for commercial applications.

Since OLEDs do not need a separate light source, unlike liquid crystal displays, they can have a relatively thin profile and light weight. Moreover, OLEDs display have low power consumption, high luminance and high response speed.

SUMMARY

One aspect is an organic light emitting diode display that includes a microlens array and minimizes image blurring which can be caused by the microlens array.

Another aspect is an organic light emitting diode display including: a substrate; an organic light emitting diode including a first electrode located on the substrate, an organic emission layer located on the first electrode, and a second electrode located on the organic emission layer; an encapsulation layer located on the substrate, with the organic light emitting diode interposed therebetween, and encapsulating the organic light emitting diode; and a microlens array neighboring the encapsulation layer, wherein the distance between the organic emission layer and the microlens array is 0.5 µm to 300 µm.

The encapsulation layer may be formed in a film shape. The microlens array may be located on the encapsulation layer. The microlens array may include a plurality of microlenses that are convex from the encapsulation layer. The microlens array and the encapsulation layer may be integrally formed. The microlens array may be located between the encapsulation layer and the organic emission layer. The microlens array may include a plurality of microlenses that are concave in the direction of the encapsulation layer.

The microlens a rray and the encapsulation layer may be integrally formed. Another aspect is an organic light emitting diode display comprising: a substrate; an organic light emitting diode including a first electrode formed on the substrate, an organic emission layer formed on the first electrode, and a second electrode formed on the organic emission layer; an encapsulation layer covering the organic light emitting diode; and a microlens array neighboring the encapsulation layer, wherein the distance between the organic emission layer and the microlens array is about 0.5 µm to about 300 µm.

In the above display, the encapsulation layer has a film shape. In the above display, the encapsulation layer has first and second surfaces opposing each other, wherein the first surface contacts the second electrode of the organic light emitting diode, and wherein the microlens array is formed on the second surface of the encapsulation layer. In the above display, the microlens array comprises a plurality of microlenses that are concave on the external surface. In the above display, the microlens array and the encapsulation layer are integrally formed.

In the above display, the microlens array is formed between the encapsulation layer and the organic emission layer, and wherein the microlens array contacts the second electrode of the OLED and is covered by the encapsulation layer. In the above display, the microlens array comprises a plurality of microlenses that are concave from the perspective of the organic light emitting diode. In the above display, the microlens array and the encapsulation layer are integrally formed. In the above display, the distance between the organic emission layer and the microlens array is greater than 36 µm, and less than or equal to 300 µm.

Another aspect is an organic light emitting diode display comprising: a substrate; a plurality of organic light emitting diodes formed over the substrate, wherein each of the organic light emitting diodes comprises i) first and second electrodes and ii) an organic emission layer interposed between the first and second electrodes, and wherein the first electrode is closer to the substrate than the second electrode; an encapsulation layer covering the organic light emitting diodes; and a plurality of microlenses formed substantially directly above the plurality of organic light emitting diodes, respectively, wherein the microlenses contact the encapsulation layer, wherein the distance between the organic emission layers and the corresponding microlenses is about 0.5 µm to about 300 µm.

In the above display, the distance is greater than 36 µm and less than or equal to 300 µm. In the above display, the encapsulation layer has first and second surfaces opposing each other, wherein the first surface contacts the organic light emitting diodes, wherein the microlenses are formed on the second surface of the encapsulation layer, and wherein the microlenses are formed substantially directly above the corresponding organic light emitting layers, respectively. In the above display, the microlenses are concave on the external surface. In the above display, the encapsulation layer has first and second surfaces opposing each other, wherein the first surface contacts the organic light emitting diodes, and wherein the microlenses are formed on the first surface of the encapsulation layer and contacts the organic light emitting diodes. In the above display, the microlenses are concave from the perspective of the organic light emitting diodes.

Another aspect is an organic light emitting diode display comprising: a substrate; first and second organic light emitting diodes formed over the substrate, wherein each of the first and second organic light emitting diodes comprises i) first and second electrodes and ii) an organic emission layer interposed between the electrodes and configured to emit light, and wherein the first electrode is closer to the substrate than the second electrode; an encapsulation layer encapsulating the first and second organic light emitting diodes; and first and second microlenses adjacent to each other, wherein the microlenses contact the encapsulation layer and are formed substantially directly above the organic emission layers, respectively, wherein the first microlens is configured to refract first light emitted from the organic emission layer of the first organic light emitting diode, and wherein the first refracted light forms a first virtual image adjacent to the organic emission layer of the first organic light emitting diode, wherein the first microlens is configured to refract second light emitted from the organic emission layer of the second organic light emitting diode, and wherein the second refracted light forms a second virtual image adjacent to the organic emission layer of the second organic light emitting diode, and wherein the distance between the organic emission layers and the corresponding microlenses is determined such that the first virtual image does not overlap with the second virtual image.

In the above display, the distance is about 0.5 μm to about 300 μm. In the above display, the distance is greater than 36 μm, and less than or equal to 300 μm. In the above display, the encapsulation layer has first and second surfaces opposing each other, wherein the first surface contacts the organic light emitting diodes, and wherein the microlenses are formed on the second surface of the encapsulation layer. In the above display, the encapsulation layer has first and second surfaces opposing each other, wherein the first surface contacts the organic light emitting diodes, and wherein the microlenses are formed on the first surface of the encapsulation layer and contact the organic light emitting diodes.

DETAILED DESCRIPTION

Figure 1:
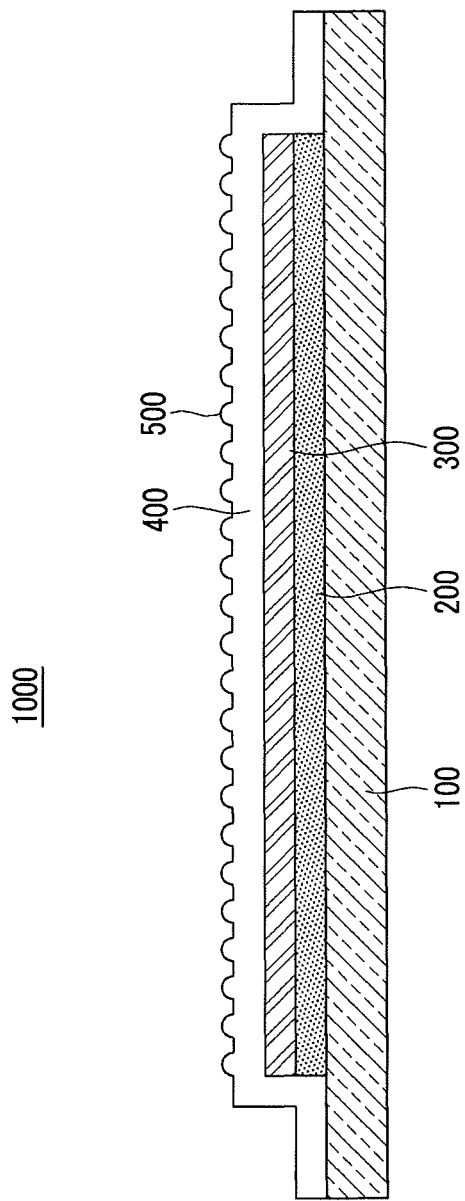
FIG. 1 is a cross-sectional view showing an organic light emitting diode display according to a first exemplary embodiment.

An organic light emitting diode (OLED) display generally includes i) a first substrate where an OLED including an organic emission layer is formed, and ii) a second substrate facing the first substrate and protecting the OLED formed on the first substrate. Such an OLED device displays an image using light emitted from the organic emission layer.

Recently, an OLED display that has a microlens array positioned in the optical path of light emitted from the organic emission layer has been developed in order to improve the optical efficiency of the light emitted from the organic emission layer.

Although such a display improves optical efficiency, displayed images are generally blurred because the light emitted from the organic emission layer is refracted by the curved surfaces of the microlenses.

Hereinafter, exemplary embodiments will be described in detail with reference to the accompanying drawings. The described embodiments are merely exemplary and thus they are not considered limiting.

To clearly describe the exemplary embodiments, parts not related to the description are omitted, and like reference numerals designate like constituent elements throughout the specification.

Constituent elements having the same structures throughout the embodiments are denoted by the same reference numerals and are described in a first exemplary embodiment.

In the subsequent exemplary embodiments, only the constituent elements other than the same constituent elements are described.

In the drawings, the sizes and thicknesses of the components are merely shown for convenience of explanation, and therefore they are not considered limiting.

Also, the thickness of layers, films, panels, regions, etc., may be exaggerated for clarity. Furthermore, the thicknesses of some layers and areas may be exaggerated for convenience of explanation. When it is described that one element such as a layer, a film, an area, a plate, etc., is formed on another element, it means that one element exists right on another element or that one element exists on another element with a further element therebetween.

Throughout this specification and the claims that follow, unless explicitly described to the contrary, the word "comprise" and variations such as "comprises" or "comprising" will be understood to imply the inclusion of stated elements but not the exclusion of any other elements. Throughout this specification, it is understood that the term "on" and similar terms are used generally and are not necessarily related to a gravitational reference.

Hereinafter, an organic light emitting diode (OLED) display 1000 according to a first exemplary embodiment will be described with reference to FIGS. 1 to 5.

FIG. 1 is a cross-sectional view showing an OLED display according to a first exemplary embodiment.

As shown in FIG. 1, the OLED display 1000 includes a substrate 100, wiring 200, an OLED 300, an encapsulation layer 400, and a microlens array 500.

In one embodiment, the first substrate 100 is a light transmissive and electrical insulating substrate made of a material including glass, a polymer, or the like. The substrate 100 faces the encapsulation layer 400 with the wiring 200 and the OLED 300 interposed therebetween, and the encapsulation layer 400 is bonded to the substrate 100 in a region where the wiring 200 and the OLED 300 are not located. The wiring 200 and the OLED 300 are located on the substrate 100.

In one embodiment, the wiring 200 includes switching and driving thin film transistors 10 and 20 (shown in FIG. 2), and transmits a signal to the OLED 300 to drive it. The OLED 300 emits light according to a signal received from the wiring 200.

The organic light emitting element 300 may be positioned on the wiring 200.

The OLED 300 may be positioned in a display area on the substrate 100, and displays an image by a signal received from the wiring 200.

Now, the internal structure of the OLED display 1000 according to the first exemplary embodiment will be described in detail with reference to FIGS. 2 and 3.

Figure 2:
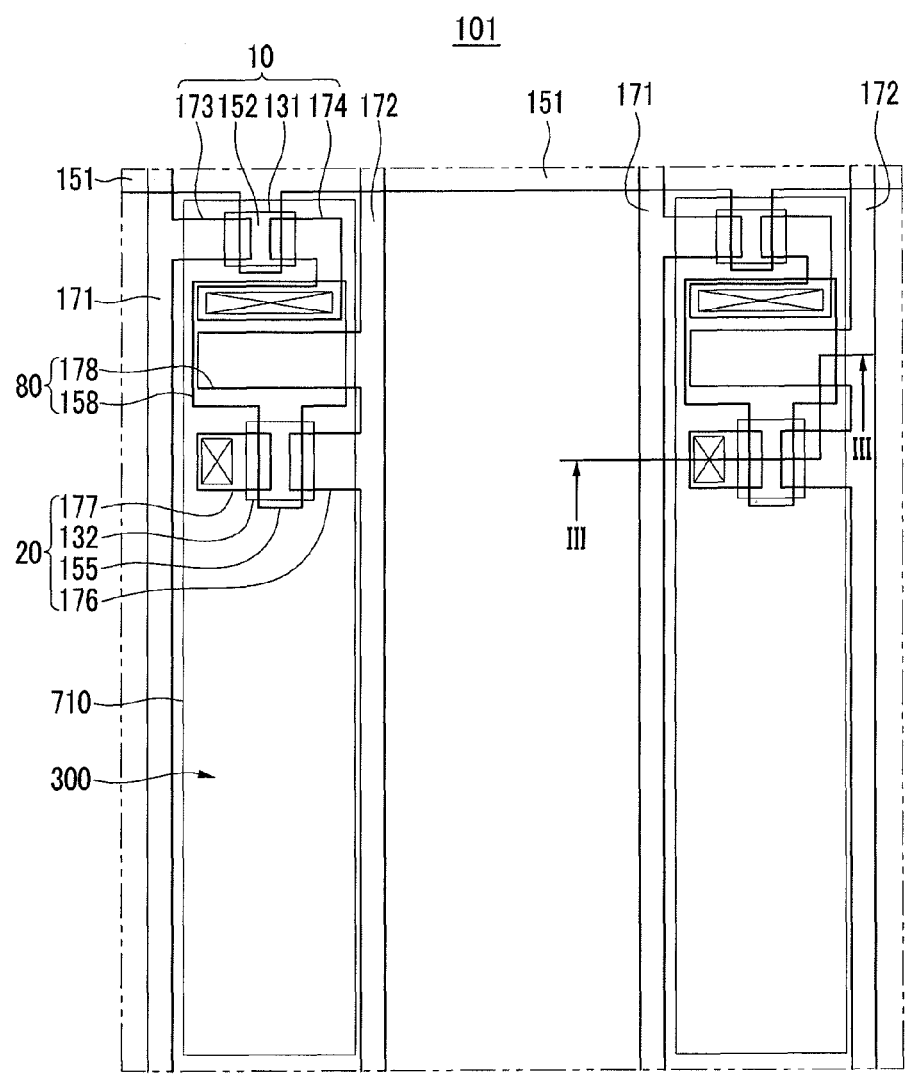
FIG. 2 is a layout view showing a pixel of the organic light emitting diode display according to the first exemplary embodiment.

FIG. 2 is a layout view showing a pixel 101 of the OLED display according to the first exemplary embodiment. FIG. 3 is a cross-sectional view taken along line III-III of FIG. 2.

Figure 3:
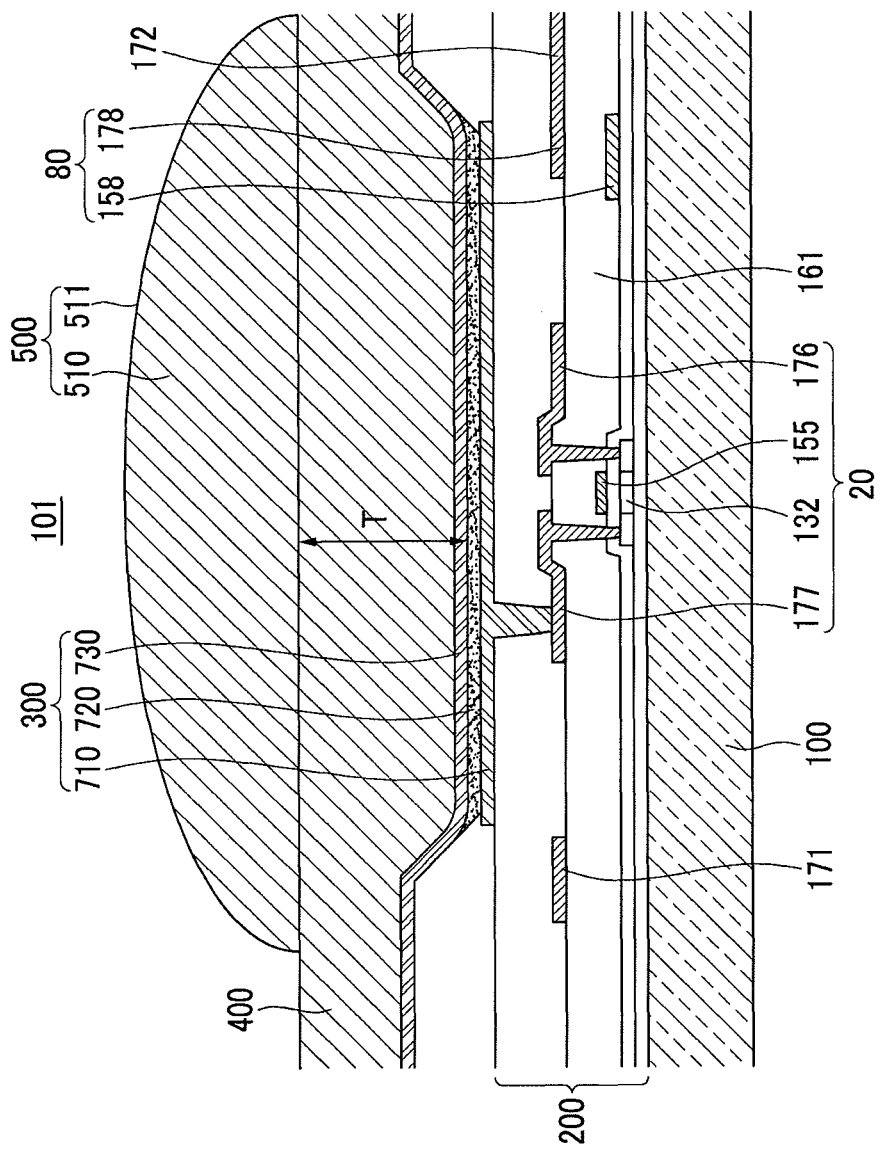
FIG. 3 is a cross-sectional view taken along line III-III of FIG. 2.

Concrete structures of the wiring 200 and the OLED 300 are shown in FIGS. 2 and 3, but the present embodiment is not limited to the structures shown in FIGS. 2 and 3. The wiring 200 and the OLED 300 may have various structures within the scope in which a person skilled in the art may easily change.

In one embodiment, the OLED display is an active matrix (AM) type in which one pixel includes two thin film transistors (TFTs) and one capacitor (2Tr-1Cap structure). However, the number of thin film transistors, the number of capacitors, and the number of lines of the display device are not limited. In one embodiment, a pixel refers to the smallest unit displaying an image, and the display device displays an image through a plurality of pixels.

As shown in FIGS. 2 and 3, each pixel of the OLED display 1000 includes a switching thin film transistor 10, a driving thin film transistor 20, a capacitor 80, and an OLED 300. Here, a component including the switching thin film transistor 10, the driving thin film transistor 20, and the capacitor 80 is referred to as the wiring 200. The wiring 200 further includes i) a gate line 151 arranged along one direction of the first substrate 100, ii) a data line 171 insulated from and crossing the gate line 151, and iii) a common power line 172. One pixel may be defined by the gate line 151, the data line 171, and the common power line 172, but the present embodiment is not necessarily limited thereto.

The OLED 300 includes i) a first electrode 710, ii) an organic emission layer 720 positioned on the first electrode 710, and iii) a second electrode 730 positioned on the organic emission layer 720. The first electrode 710 may be an anode serving as a hole injection electrode, and the second electrode 730 may be a cathode serving as an electron injection electrode. However, the pixel electrode 710 may be a cathode and the common electrode 730 may be an anode according to a driving method of the OLED display 1000. That is, holes and electrons are injected into the organic emission layer 720 from the first electrode 710 and the second electrode 730, respectively, and when excitons formed by recombinations of the injected holes and electrons drop from an excited state to a ground state, the organic emission layer 720 emits light. In one embodiment, either the first electrode 710 or the second electrode 730 may be a reflective electrode, and the other one may be a transmissive electrode. In another embodiment, both of the first electrode 710 and the second electrode 730 may be transmissive electrodes. In the OLED display 1000 according to the first exemplary embodiment, the first electrode 710 is formed at least partially of a reflective material and the second electrode 730 is formed at least partially of a transmissive material. That is, the OLED display according to the first exemplary embodiment is a front transmissive OLED display, and the light emitted from the organic emission layer 720 is irradiated in the direction of the encapsulation layer 400. At least one of the first electrode 710 and the second electrode 730 includes a single or multiple layered conductive layer containing at least one of lithium (Li), aluminum (Al), calcium (Ca), magnesium (Mg), silver (Ag), magnesium-silver (MgAg), lithium-aluminum (LiAl), indium tin oxide (ITO), and indium zinc oxide (IZO).

The organic emission layer 720 may include a main emission layer, an organic hole layer located between the main emission layer and the first electrode 710, and an electron organic layer located between the main emission layer and the second electrode 730. The main emission layer may combine holes and electrons that are injected from the first electrode 710 and the second electrode 730, respectively, the organic hole layer may include one or more electron injection layers and one or more hole transport layers, and the organic electron layer may include one or more electron injection layers and one or more electron transport layers. The organic emission layer 720 may emit light of at least one of red, green, and blue colors.

The capacitor 80 includes a pair of capacitor plates 158 and 178 disposed with an interlayer insulation layer 161 interposed therebetween. In one embodiment, the interlayer insulation layer 161 is a dielectric material, and the storage capacity of the capacitor 80 is determined by the electric charges stored in the capacitor 80 and the voltage between the capacitor plates 158 and 178.

The switching thin film transistor 10 includes a switching semiconductor layer 131, a switching gate electrode 152, a switching source electrode 173, and a switching drain electrode 174. The driving thin film transistor 20 includes a driving semiconductor layer 132, a driving gate electrode 155, a driving source electrode 176, and a drain electrode 177.

The switching thin film transistor 10 is used as a switching element to select a pixel to emit light. The switching gate electrode 152 is electrically connected to the gate line 151. The switching source electrode 173 is electrically connected to the data line 171. The switching drain electrode 174 is spaced apart from the switching source electrode 173 and electrically connected to the capacitor plate 158.

The driving thin film transistor 20 applies driving power to the first electrode 710 for allowing the organic emission layer 720 of the OLED 300 in the selected pixel to emit light. The driving gate electrode 155 is electrically connected to the capacitor plate 158 electrically connected to the switching drain electrode 174. The driving source electrode 176 and the other capacitor plate 178 are electrically connected to the common power line 172. The driving drain electrode 177 is electrically connected to the first electrode 710 of the OLED 300 via a contact hole.

With the above-described configuration, the switching thin film transistor 10 is driven by a gate voltage applied to the gate line 151 and supplies a data voltage applied to the data line 171 to the driving thin film transistor 20. A voltage corresponding to the difference between the common voltage, which is supplied from the common power line 172 to the driving thin film transistor 20, and the data voltage, which is supplied from the switching thin film transistor 10, is stored in the capacitor 80. A current corresponding to the voltage stored in the capacitor 80 flows into the OLED 300 through the driving thin film transistor 20 to make the OLED 300 emit light.

Referring again to FIGS. 1 and 3, the encapsulation layer 400 is located on the substrate 100, with the OLED 300 interposed therebetween, and encapsulates the OLED 300. In one embodiment, the encapsulation layer 400 is formed in a film shape and bonded to the substrate 100 so as to enclose the OLED 300, and the wiring 200 and the OLED 300 are protected from external interference by the encapsulation layer 400 and the substrate 100. With the film shape of the encapsulation layer 400, if the substrate 100 is made thin, a flexible OLED display 1000 having an overall small thickness can be realized.

In one embodiment, a microlens array 500 is located near or neighbors the encapsulation layer 400.

In one embodiment, the microlens array 500 is located on the encapsulation layer 400, and includes a plurality of microlenses 510, each corresponding to one organic emission layer 720 located in one pixel. In one embodiment, the microlenses 510 may be concave from the perspective of the encapsulation layer 400. In another embodiment, the microlenses 510 may be concave from the perspective of the OLED 300. The microlens array 500 is located in the optical path of the light emitted from the organic emission layer 720 and irradiated in the direction of the encapsulation layer 400, and plays the role of improving the optical efficiency of the light emitted from the organic emission layer 720 by focusing the light emitted from the organic emission layer 720. In one embodiment, the microlens array 500 is formed integrally with the encapsulation layer 400, and may be formed substantially simultaneously when the encapsulation layer 400 is bonded to the substrate 100, with the wiring 200 and the OLED 300 interposed therebetween, so as to encapsulate the wiring 200 and the OLED 300. In one embodiment, the distance T between the microlens array 500 and the organic emission layer 720 is about 0 μm to about 300 μm, or about 0.5 μm to about 300 μm. This range (about 0.5 μm to about 300 μm) may provide an optimum balance between the protective ability of the encapsulation layer 400 and minimizing or prevention of display images being blurred. In another embodiment, the distance is about 100 μm to about 300 μm. In another embodiment, the distance is greater than 36 μm and less than or equal to 300 μm. In another embodiment, the distance is about 0.5 μm to about 36 μm. In still another embodiment, the distance is about 36 μm to about 100 μm.

A test for observing the occurrence of image blurring will be described below with reference to FIG. 4.

Figure 4:
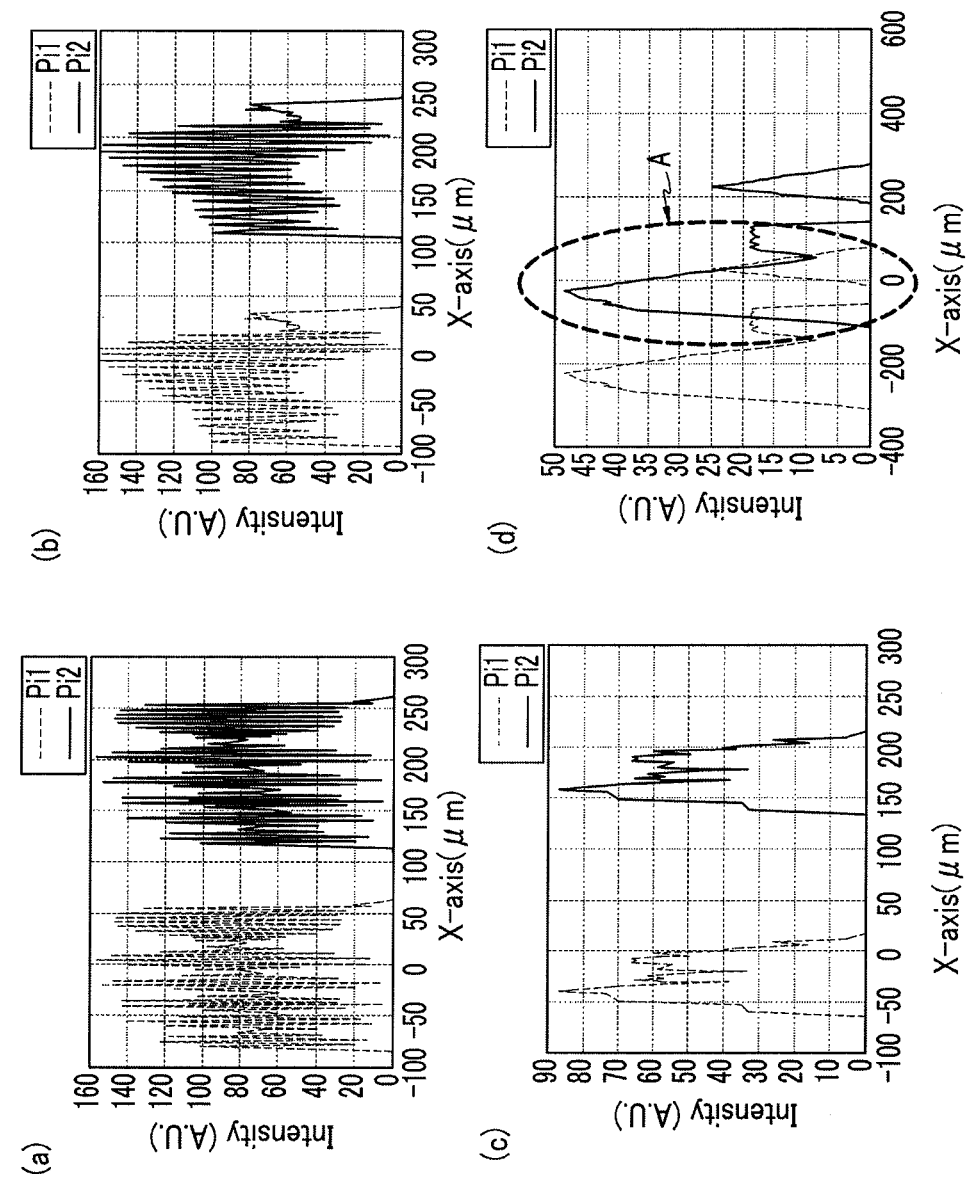
FIG. 4 shows test graphs showing the occurrence of image blurring depending on the distance between an organic emission layer and a microlens array.

FIG. 4 shows test graphs showing the occurrence of image blurring depending on the distance between the organic emission layer and the microlens array. In the graphs shown in FIG. 4, the x-axis represents left and right with respect to one axis (x-axis), the y-axis represents the intensity of light emitted from the organic emission layer, a dotted line graph represents the light emitted from the organic emission layer corresponding to a first pixel Pi1 of two neighboring pixels, and a solid line graph represents the light emitted from the organic emission layer corresponding to a second pixel Pi2 of the two neighboring pixels.

First, (a) of FIG. 4 is a graph showing the occurrence of image blurring when the distance T between the organic emission layer 720 and the microlens array 500 is set to about 100 μm. As shown in (a) of FIG. 4, it was observed that the blurring of the lights emitted from the organic emission layers of the first pixel Pi1 and second pixel Pi2 was suppressed at approximately 60 μm to approximately 110 μm with respect to the axes.

(b) of FIG. 4 is a graph showing the occurrence of image blurring when the distance T between the organic emission layer 720 and the microlens array 500 is set to about 200 μm. As shown in (b) of FIG. 4, it was observed that the blurring of the lights emitted from the organic emission layers of the first pixel Pi1 and second pixel Pi2 was suppressed at approximately 40 μm to approximately 105 μm with respect to the axes.

(c) of FIG. 4 is a graph showing the occurrence of image blurring when the distance T between the organic emission layer 720 and the microlens array 500 is set to about 300 μm. As shown in (c) of FIG. 4, it was observed that the blurring of the lights emitted from the organic emission layers of the first pixel Pi1 and second pixel Pi2 was suppressed at approximately 20 μm to approximately 135 μm with respect to the axes.

(d) of FIG. 4 is a graph showing the occurrence of image blurring when the distance T between the organic emission layer 720 and the microlens array 500 is set to about 1000 μm. As shown in (d) of FIG. 4, it was observed that image blurring occurred at region A in the graph. That is, it was observed that the lights emitted from the organic emission layers of the first pixel Pi1 and second pixel Pi2 blurred into each another at approximately 20 μm to approximately 135 μm with respect to the axes.

Through the above test, it was found that, if the distance T between the organic emission layer 720 and the microlens array 500 is about 0.5 μm to about 300 μm, blurring in the images displayed on the OLED display 1000 was minimized. In one embodiment, the distance T between the organic emission layer 720 and the microlens array 500 is about 0.5 μm to about 300 μm, the OLED display 1000 prevents or significantly reduces image blurring.

The reason why image blurring is minimized depending on the distance T between the organic emission layer 720 and the microlenses 510 will be discussed below with reference to FIG. 5.

Figure 5:
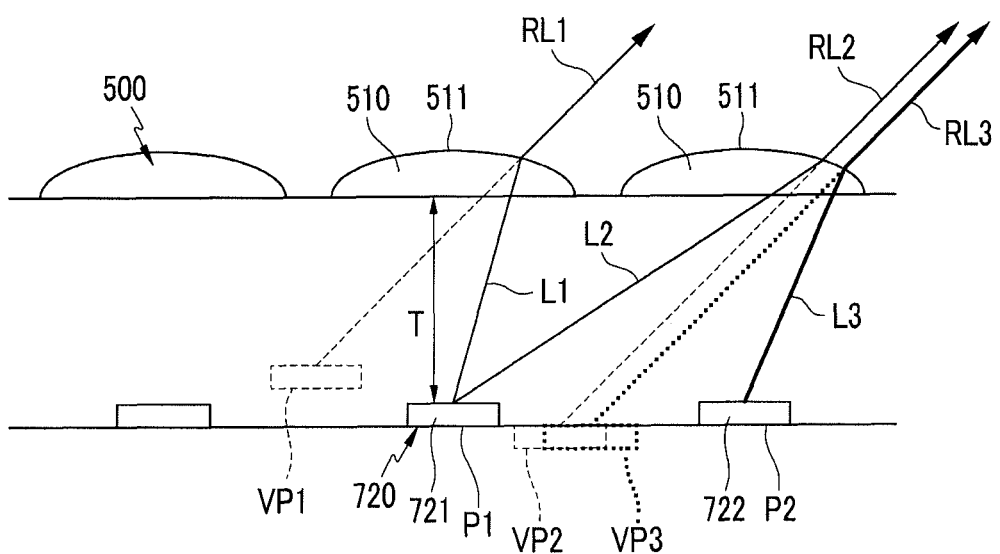
FIG. 5 is a view for explaining why image blurring is minimized depending on the distance between the organic emission layer and the microlens array.

FIG. 5 is a view for explaining why image blurring is minimized depending on the distance between the organic emission layer and the microlens array. For better understanding and ease of description, FIG. 5 mainly illustrates organic emission layers 721 and 722 and the microlens array 500.

As shown in FIG. 5, the microlens array 500 is located on the first organic emission layer 721 and second organic emission layer 722 neighboring each other, and each of the microlenses 510 included in the microlens array 500 corresponds to each of the organic emission layers 721 and 722.

First, a first light L1 and a second light L2 emitted from the first organic emission layer 721 are respectively refracted as a first refracted light RL1 and a second refracted light RL2 through the curved surfaces of the microlenses 510. When viewing the first refracted light RL1 and the second refracted light RL2, respectively, an observer observing the image displayed by the first organic emission layer 721 recognizes an actual first place P1, where the first organic emission layer 721 is located, as a first virtual place VP1 and a second virtual place VP2 by the first refracted light RL1 and the second refracted light RL2, respectively. Similarly, a third light L3 emitted from the second organic emission layer 722 neighboring the first organic emission layer 721 is refracted as a third refracted light RL3 through the curved surfaces 511 of the microlenses 510. When viewing the third refracted light RL3, the observer observing the image displayed by the second organic emission layer 722 recognizes an actual second place P2, where the second organic emission layer 722 is located, as a third virtual place VP3 by the third refracted light RL3. In this manner, the first place P1 of the first organic emission layer 721 is recognized as the first virtual place VP1 and the second virtual place VP2 as the first light L1 and second light L2 emitted from the first organic emission layer 721 are refracted. Further, the second place P2 of the second organic emission layer 722 is recognized as the third virtual place VP3 as the third light L3 emitted from the second organic emission layer 722 is refracted. Thus, the second virtual place VP2 of the first organic emission layer 721 and the third virtual place VP3 of the second organic emission layer overlap each other, thus causing image blurring to occur in the image displayed by the first organic emission layer 721 and the image displayed by the second organic emission layer 722.

However, when the distance T between each of the first and second organic emission layers 721 and 722 and the microlens array 500 is about 0.5 μm to about 300 μm, that is, a region between each of the first and second organic emission layers 721 and 722 and the microlens array 500, has a thin film shape, the distance T from each of the first and second organic emission layers 721 and 722 to the curved surfaces 511 of the microlenses 510 becomes much shorter. Therefore, the second virtual place VP2 of the first organic emission layer 721 and the third virtual place VP3 of the second organic emission layer 722 are prevented from overlapping each other, thereby preventing the images displayed by the first and second organic emission layers 721 and 722 from blurring into each other. In another embodiment, the distance T can be defined such that a virtual image (e.g., VP3) produced by an organic emission layer (e.g., 722) and a microlens (e.g., 510) does not overlap with a virtual image produced by an adjacent organic emission layer (e.g., 721) and the same microlens. In one embodiment, the distance T can be greater than 0 μm and less than 1000 μm. In another embodiment, the distance T can be about i) 0 μm to about 300 μm, ii) about 0.5 μm to about 300 μm, iii) greater than 36 μm and less than or equal to 300 μm, iv) about 0.5 μm to about 36 μm, v) about 36 μm to about 100 μm or vi) about 100 μm to about 300 μm. These ranges apply to the FIG. 6 embodiment.

That is, the occurrence of image blurring of the OLED display 1000 is minimized.

That is, the OLED display 1000 improves the optical efficiency of the light emitted from the organic emission layer 720 by having the microlens array 500 located on the optical path, and minimizes image blurring, whereby the overall display quality of images displayed by the OLED display 1000 is improved.

In one embodiment, the OLED display 1000 is a top emission OLED display 1000 by forming the first electrode 710 as a reflective electrode and the second electrode 730 as a transmissive electrode. In another embodiment, the OLED display may be implemented as a bottom emission OLED display by forming the first electrode as a transmissive electrode and the second electrode as a reflective electrode. The microlens array of the bottom emission OLED display may be located on the substrate in the optical path of light emitted from the organic emission layer. Furthermore, the OLED display may be implemented as a dual emission display by having both of first and second electrodes as transmissive electrodes, and the microlens array of the dual emission OLED display may be located on both the substrate in the optical path of light emitted from the organic emission layer and the encapsulation layer.

Hereinafter, an OLED display 2000 according to a second exemplary embodiment will be described with reference to FIG. 6.

Figure 6:
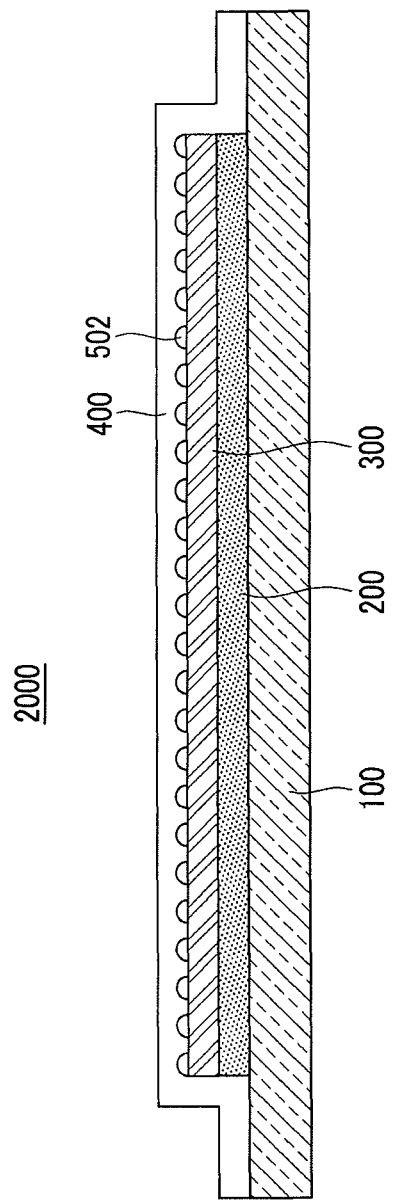
FIG. 6 is a cross-sectional view showing an organic light emitting diode display according to the second exemplary embodiment.

FIG. 6 is a cross-sectional view showing an OLED display according to the second exemplary embodiment.

As shown in FIG. 6, a microlens array 502 is located between an encapsulation layer 400 and an OLED 300 including an organic emission layer 720. The microlens array 502 includes a plurality of microlenses 510, each corresponding to one organic emission layer 720 located in one pixel. The microlenses 510 may be concave from the perspective of the encapsulation layer 400, or may be concave from the perspective of the OLED 300. In one embodiment, the microlens array 502 is formed integrally with the encapsulation layer 400, and may be formed substantially simultaneously when the encapsulation layer 400 is bonded to the substrate 100, with the wiring 200 and the OLED 300 interposed between, so as to encapsulate the wiring 200 and the OLED 300.

Moreover, the microlens array 502 may be formed of a material having a different refractive index from that of the encapsulation layer 400, or may be formed in a configuration forming a hollow space.

In one embodiment, the microlens array 502 of the OLED display 2000 is located between the organic emission layer 720 and the encapsulation layer 400, and thus the distance between the organic emission layer 720 and the microlens array 502 can be further narrowed in comparison with the OLED display 1000 according to the first exemplary embodiment. Therefore, the image blurring of the OLED display 2000 can be further minimized.

At least one embodiment minimizes image blurring in an OLED display including a microlens array, whereby the overall image quality of the OLED display is improved.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode display comprising:
a substrate;
first and second organic light emitting diodes formed over the substrate, wherein each of the first and second organic light emitting diodes comprises i) first and second electrodes and ii) an organic emission layer interposed between the electrodes and configured to emit light, and wherein the first electrode is closer to the substrate than the second electrode;
an encapsulation layer encapsulating the first and second organic light emitting diodes; and
first and second microlenses spaced apart from each other, wherein the microlenses contact the encapsulation layer, wherein the organic emission layer of the first organic light emitting diode is separated from the organic emission layer of the second organic light emitting diode, wherein each of the microlenses has a center, wherein the organic emission layers are formed directly below the centers of the microlenses, respectively, and wherein only one microlens is formed above only one organic emission layer,
wherein the first microlens is configured to refract first light emitted from the organic emission layer of the first organic light emitting diode, and wherein the first refracted light forms a first virtual image adjacent to the organic emission layer of the first organic light emitting diode, wherein the second microlens is configured to refract second light emitted from the organic emission layer of the second organic light emitting diode, wherein the second refracted light forms a second virtual image adjacent to the organic emission layer of the second organic light emitting diode, wherein a distance between the top of each of the organic emission layers and bottom of each of the corresponding microlenses is determined such that the first virtual image does not overlap with the second virtual image, wherein the top and bottom face each other.

2. The display of claim 1, wherein the distance is about 0.5 μm to about 300 μm.

3. The display of claim 2, wherein the distance is greater than 36 μm, and less than or equal to 300 μm.

4. The display of claim 1, wherein the encapsulation layer has first and second surfaces opposing each other, wherein the first surface contacts the organic light emitting diodes, and wherein the microlenses are formed on the second surface of the encapsulation layer.

5. The display of claim 1, wherein the encapsulation layer has first and second surfaces opposing each other, wherein the first surface contacts the organic light emitting diodes, and wherein the microlenses are formed on the first surface of the encapsulation layer and contact the organic light emitting diodes.

6. The display of claim 1, wherein a gap is formed between the first and second microlenses, and wherein neither of the organic emission layers is formed directly below the gap.

* * * * *